United States Patent
Johnston et al.

(10) Patent No.: US 9,685,573 B2
(45) Date of Patent: Jun. 20, 2017

(54) DIODE AND HEAT SPREADER FOR SOLAR MODULE

(71) Applicant: SunPower Corporation, San Jose, CA (US)

(72) Inventors: Keith Johnston, Palo Alto, CA (US); Ryan Linderman, Oakland, CA (US); Lewis Abra, San Francisco, CA (US); Matthew Dawson, Menlo Park, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 336 days.

(21) Appl. No.: 14/058,867

(22) Filed: Oct. 21, 2013

(65) Prior Publication Data

US 2014/0048119 A1 Feb. 20, 2014

Related U.S. Application Data (62) Division of application No. 12/906,688, filed on Oct. 18, 2010, now Pat. No. 8,563,849.

(60) Provisional application No. 61/370,242, filed on Aug. 3, 2010.

(51) Int. Cl.
| | | |
|---|---|---|
| *H01L 31/00* | (2006.01) | |
| *H01L 31/052* | (2014.01) | |
| *H01L 31/049* | (2014.01) | |
| *H01L 31/044* | (2014.01) | |
| *H02S 40/42* | (2014.01) | |

(52) U.S. Cl.
CPC .......... *H01L 31/052* (2013.01); *H01L 31/044* (2014.12); *H01L 31/049* (2014.12); *H02S 40/42* (2014.12); *Y02E 10/50* (2013.01)

(58) Field of Classification Search
CPC ... H01L 31/044; H01L 31/049; H01L 31/052; Y02E 10/50
USPC .................................................. 136/246, 256
See application file for complete search history.

(56) References Cited

U.S. PATENT DOCUMENTS

| | | |
|---|---|---|
| 4,153,474 A | 5/1979 | Rex |
| 4,323,719 A | 4/1982 | Green |
| 4,373,783 A | 2/1983 | Anderson |
| 4,456,332 A | 6/1984 | Anderson |
| 4,468,848 A | 9/1984 | Anderson et al. |
| 4,468,849 A | 9/1984 | Anderson et al. |
| 4,481,378 A | 11/1984 | Lesk |
| 4,502,200 A | 3/1985 | Anderson et al. |

(Continued)

FOREIGN PATENT DOCUMENTS

| | | |
|---|---|---|
| CN | 101378086 A | 3/2009 |
| DE | 100 50 614 C1 | 10/2000 |

(Continued)

OTHER PUBLICATIONS

First Office Action dated Dec. 31, 2014, Chinese Patent Application No. 201180015293.5 filed Jul. 20, 2012, 17 pages.

(Continued)

*Primary Examiner* — Matthew Martin
(74) *Attorney, Agent, or Firm* — Oblon, McClelland, Maier & Neustadt, L.L.P.

(57) ABSTRACT

Arrangements of diodes and heat spreaders for solar modules are described. For example, a solar module may include a backsheet with a low profile, surface-mount diode disposed above the backsheet. A pair of ribbon interconnects is coupled to the low profile, surface-mount diode and may penetrate the backsheet.

22 Claims, 3 Drawing Sheets

(56) References Cited

U.S. PATENT DOCUMENTS

| | | |
|---|---|---|
| 4,567,316 A * | 1/1986 | Hollaus ............ H01L 31/044 136/244 |
| 4,640,734 A | 2/1987 | Roberts et al. |
| 4,643,543 A | 2/1987 | Mohn et al. |
| 4,643,544 A | 2/1987 | Loughran |
| 4,759,803 A | 7/1988 | Cohen |
| 5,180,441 A | 1/1993 | Cornwall et al. |
| 5,248,346 A | 9/1993 | Fraas et al. |
| 5,298,768 A | 3/1994 | Okazaki et al. |
| 5,334,496 A | 8/1994 | Pond et al. |
| 5,344,496 A | 9/1994 | Stern et al. |
| 5,389,158 A | 2/1995 | Fraas et al. |
| 5,409,549 A | 4/1995 | Mori |
| 5,498,297 A | 3/1996 | O'Neill et al. |
| 5,580,395 A | 12/1996 | Yoshioka et al. |
| 5,616,185 A | 4/1997 | Kukulka |
| 5,660,644 A | 8/1997 | Clemens |
| 5,697,192 A | 12/1997 | Inoue |
| 5,865,905 A | 2/1999 | Clemens |
| 5,899,199 A | 5/1999 | Mills |
| 5,990,415 A | 11/1999 | Green et al. |
| 6,034,322 A | 3/2000 | Pollard |
| 6,131,565 A | 10/2000 | Mills |
| 6,198,171 B1 | 3/2001 | Huang et al. |
| 6,323,478 B1 | 11/2001 | Fujisaki et al. |
| 6,359,209 B1 | 3/2002 | Glenn et al. |
| 6,442,937 B1 | 9/2002 | Stone |
| 6,531,328 B1 | 3/2003 | Chen |
| 6,553,729 B1 | 4/2003 | Nath et al. |
| 6,607,942 B1 | 8/2003 | Tsao et al. |
| 6,635,507 B1 | 10/2003 | Boutros et al. |
| 7,183,587 B2 | 2/2007 | Negley et al. |
| 7,304,326 B2 | 12/2007 | Suehiro et al. |
| 7,468,485 B1 | 12/2008 | Swanson |
| 7,554,031 B2 | 6/2009 | Swanson et al. |
| 7,709,730 B2 | 5/2010 | Johnson et al. |
| 7,714,341 B2 | 5/2010 | Keun et al. |
| 7,820,906 B2 | 10/2010 | Johnson et al. |
| 7,825,327 B2 | 11/2010 | Johnson et al. |
| 7,906,793 B2 | 3/2011 | Negley |
| 7,932,461 B2 | 4/2011 | Johnson et al. |
| 7,952,057 B2 | 5/2011 | Finot et al. |
| 7,968,791 B2 | 6/2011 | Do et al. |
| 7,985,919 B1 | 7/2011 | Roscheisen et al. |
| 8,039,777 B2 | 10/2011 | Lance et al. |
| 8,049,150 B2 | 11/2011 | Johnson et al. |
| 8,071,930 B2 | 12/2011 | Wylie et al. |
| 8,083,362 B2 | 12/2011 | Finot et al. |
| 8,125,000 B2 | 2/2012 | Kim et al. |
| 8,530,990 B2 | 9/2013 | Linderman et al. |
| 8,537,554 B1 * | 9/2013 | Hockaday ............ H01L 31/052 136/246 |
| 8,563,849 B2 | 10/2013 | Johnston et al. |
| 8,809,671 B2 | 8/2014 | Linderman et al. |
| 8,860,162 B2 | 10/2014 | Linderman et al. |
| 2002/0140079 A1 | 10/2002 | Takeyama |
| 2004/0074490 A1 | 4/2004 | Mills et al. |
| 2005/0035444 A1 | 2/2005 | Huang |
| 2005/0133086 A1 | 6/2005 | Itoyama et al. |
| 2005/0141195 A1 | 6/2005 | Pokharna et al. |
| 2006/0042681 A1 | 3/2006 | Korman |
| 2006/0054210 A1 | 3/2006 | Proisy et al. |
| 2006/0060867 A1 | 3/2006 | Suehiro |
| 2006/0097385 A1 | 5/2006 | Negley |
| 2006/0124953 A1 | 6/2006 | Negley et al. |
| 2006/0137733 A1 | 6/2006 | Schripsema et al. |
| 2006/0170094 A1 | 8/2006 | Subramanian et al. |
| 2007/0074755 A1 | 4/2007 | Eberspacher et al. |
| 2007/0089774 A1 | 4/2007 | Lasich |
| 2007/0151598 A1 | 7/2007 | De Ceuster et al. |
| 2007/0257274 A1 | 11/2007 | Martter et al. |
| 2008/0011348 A1 | 1/2008 | Aoyama et al. |
| 2008/0035198 A1 | 2/2008 | Teppe et al. |
| 2008/0083450 A1 | 4/2008 | Benoit et al. |
| 2008/0110490 A1 | 5/2008 | Duesterhoeft |
| 2008/0289680 A1 | 11/2008 | MacFarlane |
| 2008/0289682 A1 * | 11/2008 | Adriani ............ H01L 31/048 136/251 |
| 2009/0032087 A1 | 2/2009 | Kalejs |
| 2009/0032093 A1 * | 2/2009 | Fang ............ H01L 31/02008 136/255 |
| 2009/0056699 A1 | 3/2009 | Mills et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0095284 A1 | 4/2009 | Klotz |
| 2009/0134421 A1 | 5/2009 | Negley |
| 2009/0139557 A1 | 6/2009 | Rose et al. |
| 2009/0215304 A1 | 8/2009 | Faust et al. |
| 2010/0089435 A1 | 4/2010 | Lockenhoff |
| 2010/0116325 A1 * | 5/2010 | Nikoonahad ....... H01L 27/1421 136/251 |
| 2010/0147364 A1 | 6/2010 | Gonzalez et al. |
| 2010/0154788 A1 | 6/2010 | Wells et al. |
| 2010/0163014 A1 | 7/2010 | Johnson et al. |
| 2010/0175740 A1 | 7/2010 | Johnson et al. |
| 2010/0193014 A1 | 8/2010 | Johnson et al. |
| 2010/0236626 A1 | 9/2010 | Finot et al. |
| 2010/0288331 A1 * | 11/2010 | Weibezahn ............ B32B 15/08 136/246 |
| 2010/0294336 A1 | 11/2010 | Johnson et al. |
| 2010/0319682 A1 | 12/2010 | Klotz |
| 2010/0326492 A1 | 12/2010 | Tan et al. |
| 2011/0012264 A1 | 1/2011 | Linderman et al. |
| 2011/0023940 A1 | 2/2011 | Do et al. |
| 2011/0030764 A1 | 2/2011 | Seo et al. |
| 2011/0061724 A1 | 3/2011 | Houle et al. |
| 2011/0132457 A1 | 6/2011 | Finot |
| 2011/0186130 A1 | 8/2011 | Finot et al. |
| 2011/0226309 A1 | 9/2011 | Do et al. |
| 2011/0226310 A1 | 9/2011 | Johnson et al. |
| 2011/0265869 A1 | 11/2011 | Finot et al. |
| 2011/0265871 A1 | 11/2011 | Lamarche |
| 2012/0012156 A1 | 1/2012 | Linderman et al. |
| 2012/0060895 A1 | 3/2012 | Rubin et al. |
| 2012/0192574 A1 * | 8/2012 | Ghoshal ............ F25B 21/02 62/3.2 |

FOREIGN PATENT DOCUMENTS

| | | |
|---|---|---|
| DE | 10041271 | 3/2002 |
| DE | 202004005198 | 8/2004 |
| DE | 20 2009 007523 U1 | 9/2009 |
| EP | 1 544 922 A1 | 6/2005 |
| GB | 2340993 | 3/2000 |
| JP | 2005-152596 | 6/1993 |
| JP | H11 251614 A | 9/1999 |
| JP | 2000-277771 | 10/2000 |
| JP | 2001-298134 | 10/2001 |
| JP | 2003 347573 A | 12/2003 |
| JP | 2006-019532 | 1/2006 |
| JP | 2007184542 | 7/2007 |
| JP | 2007194521 | 8/2007 |
| JP | 2007214247 | 8/2007 |
| JP | 2009 010361 A | 1/2009 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO 2008/107205 | 9/2008 |
| WO | WO2008153922 | 12/2008 |
| WO | WO2009023063 | 2/2009 |
| WO | WO2009029275 | 3/2009 |
| WO | WO2009029277 | 3/2009 |
| WO | WO 2009/110757 | 9/2009 |

OTHER PUBLICATIONS

Bardwell, Karen et al., "Minimizing End Shadowing Effects on Parabolic Concentrator Arrays," IEEE, 1980, pp. 765-770.

(56) References Cited

OTHER PUBLICATIONS

Carroll, Don et al. "Production of the Alpha Solarco Proof-of-Concept Array," IEEE, 1990, pp. 1136-1141.
Edenburn, Michael W., et al. "Shading Analysis of a Photovoltaic Cell String Illuminated by a Parabolic Trough Concentrator," IEEE, 1981, pp. 63-68.
Quagan, Robert J., "Laser Diode Heat Spreaders," Ion Beam Milling, Inc., website copyright 2010, http://www.ionbeammilling.com/default.asp, 9 pgs.
Shepard, Jr., N. F. et al., "The Integration of Bypass Diodes with Terrestrial Photovoltaic Modules and Arrays," IEEE, 1984, pp. 676-681.
Stern, T. G., "Interim results of the SLATS concentrator experiment on LIPS-II (space vehicle power plants)," Photovoltaic Specialists Conference, 1988., Conference Record of the Twentieth IEEE , vol., no., pp. 837-840 vol. 2, 1988. URL: http://ieeexplore.ieee.org/stamp/stamp.jsp?tp=&arnumber=105822&isnumber=3239.
Vivar Garcia, Marta, "Optimisation of the Euclides Photovoltaic Concentrator," 2009, 390 pages.
International Search Report and Written Opinion of the International Searching Authority, PCT Appl. No. PCT/US2011/044747, filed Jul. 20, 2011.
International Search Report and Written Opinion of the International Searching Authority, PCT Appl. No. PCT/US2010/040884 (dated Jan. 25, 2011), 6 pages.
International Search Report and Written Opinion of the International Searching Authority, PCT Appl. No. PCT/US2010/056386 (dated Nov. 11, 2010), 10 pages.
JP 05-152596, Machine Translation, Takeoka, Jun. 1993, 17 pages.
Extended European Search Report dated Mar. 31, 2017 for Application No. 11815004.4, 8 pages.

* cited by examiner

DIODE AND HEAT SPREADER FOR SOLAR MODULE

CROSS-REFERENCE TO RELATED APPLICATIONS

This application is a divisional of U.S. patent application Ser. No. 12/906,688, filed Oct. 18, 2010, which claims the benefit of U.S. Provisional Application No. 61/370,242, filed Aug. 3, 2010, the entire contents of each of which are hereby incorporated by reference herein.

TECHNICAL FIELD

Embodiments of the present invention are in the field of renewable energy and, in particular, arrangements of diodes and heat spreaders for solar modules.

BACKGROUND

Light-emitting diode (LED) and photovoltaic (PV) devices are two common types of optoelectronic devices. Thermal management and assembly of optoelectronic systems, such as systems including LED and PV devices, may be considered when evaluating such systems for fabrication and deployment. For example, the area of systems of devices with cell interconnects and diodes is one area ripe for improvements in thermal management, stress management, and assembly. Challenges for the fabrication and deployment of such systems include a possible need for a low resistance thermal path in the interconnects, as well as a flexible accommodation of cells and diodes coupled to the interconnects.

DETAILED DESCRIPTION

Arrangements of diodes and heat spreaders for solar modules are described herein. In the following description, numerous specific details are set forth, such as specific arrangements of diodes and heat spreaders, in order to provide a thorough understanding of embodiments of the present invention. It will be apparent to one skilled in the art that embodiments of the present invention may be practiced without these specific details. In other instances, well-known fabrication techniques, such as lamination techniques, are not described in detail in order to not unnecessarily obscure embodiments of the present invention. Furthermore, it is to be understood that the various embodiments shown in the Figures are illustrative representations and are not necessarily drawn to scale.

Disclosed herein are diodes and heat spreaders for solar modules. In one embodiment, a solar module includes a backsheet. The solar module also includes a low profile, surface-mount diode disposed above the backsheet. The solar module also includes a pair of ribbon interconnects, each ribbon interconnect coupled to the low profile, surface-mount diode and penetrating the backsheet. The solar module also includes a heat spreader mounted directly above the low profile, surface-mount diode. In one embodiment a solar module includes a backsheet. The solar module also includes a diode disposed under the backsheet. The solar module also includes a pair of ribbon interconnects, each ribbon interconnect coupled to the diode and completely covered by the backsheet. The solar module also includes a heat spreader mounted directly above the diode.

Certain solar applications such as single-axis concentrator photovoltaic (CPV) systems require a linear arrangement of cells and a large number of diodes per string to manage higher cell temperatures and optical non-uniformities. Diodes are commonly used in photovoltaic systems to bypass cells that are electrically mismatched from others in the string. This mismatch may arise from factors such as shading or performance inconsistencies. When a cell is mismatched, its operating voltage may be modified to accommodate the string current, and the cell can be forced into reverse bias. This can cause severe heating and system performance degradation. Diodes are implemented to minimize heating and to optimize power production in mismatched circumstances.

In a typical photovoltaic module, bypass diodes are electrically connected in parallel to a string of cells. The cells are often connected in a serpentine arrangement, which may eliminate the need for long diode interconnects across the terminals of the string. Instead, an interconnect tab connected to each terminal is penetrated through a module backsheet and connected to a diode that is mounted within a junction box. However, certain applications such as single-axis concentrator photovoltaic systems require a linear arrangement of cells and a larger number of diodes per string to manage higher cell temperatures and optical non-uniformities. A centralized junction box may require a complicated bypass circuit and many busbars for diode connections. Furthermore, the junction box may need to be prohibitively large to accommodate a large number of diodes. It may be preferential to mount bypass diodes in individual packages alongside the strings being protected in applications that require a large number of diodes.

In accordance with embodiments of the present invention, a plurality diodes is incorporated into a simple, low-profile package that can be installed with minimal interference to other laminate features. In an embodiment, diodes are connected to ribbon interconnects that penetrate through a backsheet along the length of a solar module. The diodes may be low-profile, surface-mount devices that are soldered directly to the ribbons. In an embodiment, in order to manage the heating of the diodes, a heat spreader is mounted directly above the leads of one or more of the diodes. In an embodiment, the heat spreader is mounted to the backsheet with thermal adhesive to provide electrical insulation and thermal conduction. Thus, embodiments of the present invention may include using an integrated approach of mounting a heat spreader onto a diode with thermal adhesive, connecting diode leads, or just a diode, directly to a pair of ribbon interconnects, or fabricating a solar module package with a very low profile in order to minimize influences on surrounding systems (e.g., heat sinks) or to integrate directly into a laminate.

Embodiments of the present invention may address the need for a simple and low cost diode package that can be mounted on or within the backsheet of a photovoltaic module in any frequency. Although such an arrangement has been designed for a linear arrangement of cells, it may be utilized in any photovoltaic module layout. For example, in the simplest embodiment, diodes are connected to ribbon interconnects that penetrate a backsheet along the length of a module. A heat spreader may be included but must be electrically insulating on one or both sides to prevent shorting of the diode leads. In one embodiment, a thin copper or aluminum strip coated in a ceramic insulator is used to this end. In an embodiment, the heat spreader is mounted to the backsheet with thermal adhesive to provide electrical insulation and thermal conduction. In an embodiment, the heat spreader also serves to electrically isolate the diode and leads from the surroundings.

In an aspect of the present invention, a package for a solar module may include a surface mount diode disposed above a backsheet of the package. For example, FIG. 1 illustrates a cross-sectional view of a backsheet-mounted diode package, in accordance with an embodiment of the present invention.

Figure 1:
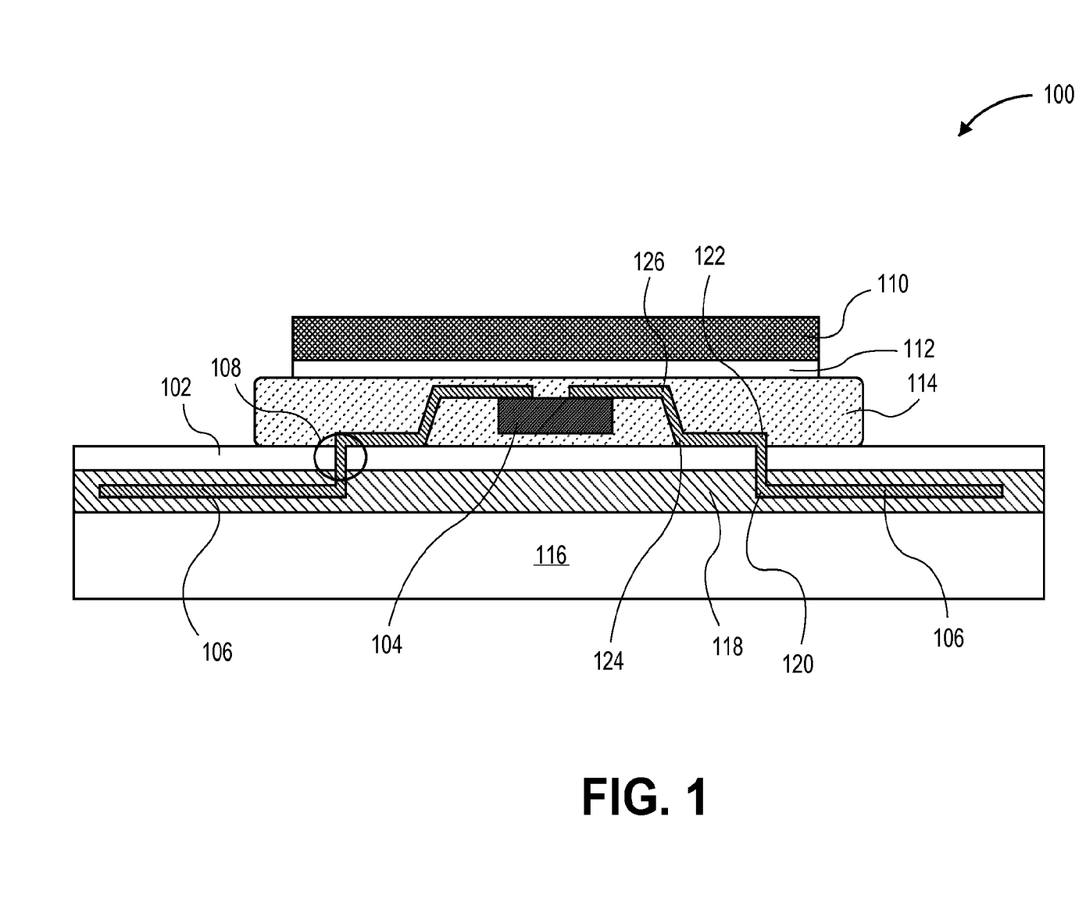
FIG. 1 illustrates a cross-sectional view of a backsheet-mounted diode package, in accordance with an embodiment of the present invention.

Referring to FIG. 1, a solar module 100 includes a backsheet 102 and a low profile, surface-mount diode 104 disposed above the backsheet 102. A pair of ribbon interconnects 106 is coupled to the low profile, surface-mount diode 104 and penetrates (at point 108) the backsheet 102. A heat spreader 110 is mounted directly above the low profile, surface-mount diode 104. The low profile aspect of the diode 104 may be in contrast to, e.g., a junction box which is a high profile feature. For example, in an embodiment, the low profile, surface-mount diode 104 rises less than 10 millimeters above the backsheet 102.

In accordance with an embodiment of the present invention, the low profile, surface-mount diode 104 is attached directly to each of the ribbon interconnects, as depicted in FIG. 1. In one embodiment, the low profile, surface-mount diode 104 is attached directly to each of the ribbon interconnects by a technique such as, but not limited to, bonding, soldering, or welding. In an embodiment, the heat spreader 110 is composed of a thin metal strip coated, by a thermally conductive dielectric 112, on at least one side of the metal strip, as is also depicted in FIG. 1. In one embodiment, the thermally conductive dielectric 112 is a ceramic insulator. In one embodiment, the heat spreader 110 is mounted to the backsheet 102 by a thermal adhesive 114. In an embodiment, the diode 104, the backsheet 102, the interconnects 106 and the heat spreader 110 are mounted above a substrate 116, such as a glass substrate, via an encapsulant 118, as depicted in FIG. 1.

Referring again to FIG. 1, in accordance with an embodiment of the present invention, each ribbon interconnect 106 includes four or more bends. A first bend 120 is included for penetration of the backsheet 102 (e.g., at location 108), a second bend 122 is included for bringing each ribbon interconnect 106 into a plane of a surface of the backsheet 106, a third bend 124 is included to bring each ribbon interconnect 106 vertical, and a fourth bend 126 is included to bring each ribbon interconnect 106 coplanar with one another and for coupling to the low profile, surface-mount diode 104. In one embodiment, the fourth bend 126 also serves to relieve stress by decoupling the interconnects 106 within a packaging laminate from diode leads outside of the laminate.

Thus, a solar module may be provided where interconnects beyond a backsheet penetration location remain within the boundaries of a heat spreader. In an embodiment, such an arrangement ensures that diode leads are electrically insulated from an outside environment by the combination of a thermal adhesive and dielectric layers disposed underneath the heat spreader. In an embodiment, the arrangement also minimizes the possibility of the diode leads shorting due to burrs or poor dielectric coverage near the edges of the heat spreader. Although it may be necessary to have dielectric coverage only on the underside of the heat spreader, total coverage may be preferred to further reduce the possibility of exposing voltage to an external environment.

In accordance with an embodiment of the present invention, completely insulating a heat spreader eliminates the need to electrically ground the heat spreader. It may be necessary to mount diode leads as close as possible to the heat spreader since they are better coupled thermally to the diode die. That is, in one embodiment, the diode temperature is minimized if there is a low resistance thermal pathway between the diode die and the heat spreader. This may be a primary motivator for inverting the diode, as is effectively the arrangement described in association with FIG. 1. In one embodiment, a thin layer of thermal adhesive is used between diode leads, or just the diode, and a heat spreader to provide a minimal thermal resistance in this pathway, enabling the diode to maintain low temperatures when it conducts current in bypass mode.

Although the arrangement described above in association with FIG. 1 significantly simplifies a diode packaging scheme, the backsheet penetrations may in fact be less desirable from a manufacturing standpoint due to the additional assembly steps needed to create slots in the backsheet as well as post-lamination steps of attaching components external to the laminate. Instead, if so desired, the diode package may be moved inside the laminate. Thus, in another aspect of the present invention, a package for a solar module may include a low profile diode disposed under a backsheet of the package. For example, FIG. 2 illustrates a cross-sectional view of an in-laminate diode package, in accordance with an embodiment of the present invention.

Figure 2:
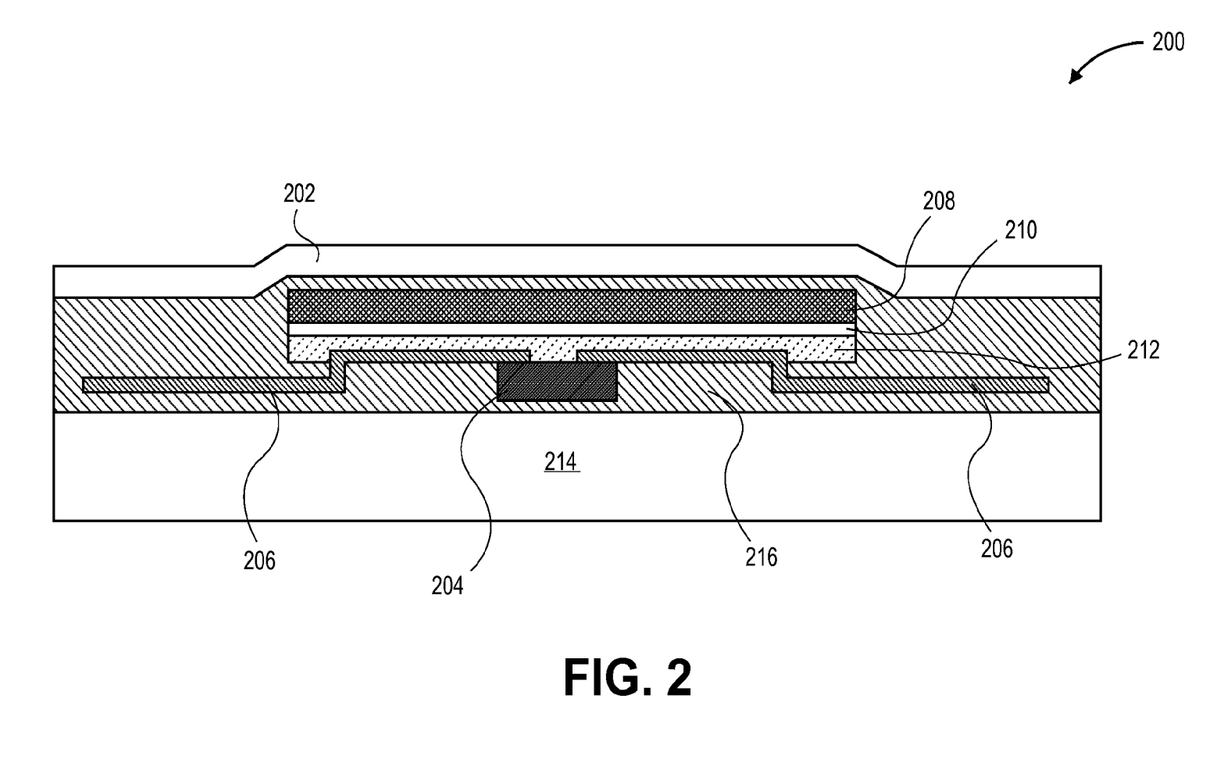
FIG. 2 illustrates a cross-sectional view of an in-laminate diode package, in accordance with an embodiment of the present invention.

Referring to FIG. 2, a solar module 200 includes a backsheet 202. A diode 204 is disposed under the backsheet 202. A pair of ribbon interconnects 206 is also included, each ribbon interconnect coupled to the diode 204 and completely covered by the backsheet 202. A heat spreader 208 is mounted directly above the diode 204. In an embodiment, each of the pair of ribbon interconnects 206 is disposed above the diode 204, and the diode 204 is completely covered by the backsheet 202, as depicted in FIG. 2.

In accordance with an embodiment of the present invention, the diode 204 is attached directly to each of the ribbon interconnects 206, as depicted in FIG. 2. In one embodiment, the diode 204 is attached directly to each of the ribbon interconnects 206 by a technique such as, but not limited to, bonding, soldering, or welding. In an embodiment, the heat spreader 208 is composed of a thin metal strip having beveled edges and coated, by a thermally conductive dielectric 210, on at least one side of the metal strip, and the heat spreader 208 is completely covered by the backsheet 202, as is also depicted in FIG. 2. In one embodiment, the heat spreader 208 is mounted, via the thermally conductive dielectric 210, to each of the ribbon interconnects 206 with a thermal adhesive 212. In an embodiment, the diode 204, the backsheet 202, the interconnects 206 and the heat spreader 210 are mounted above a substrate 214, such as a glass substrate, via an encapsulant 216.

In another aspect of the present invention, it is to be understood that non-uniform backsheet surface profiles can be induced by adding additional components within a laminate, which may lead to delamination and backsheet damage. In extreme cases, sharp edges may completely penetrate the backsheet. In order to minimize these effects, in accordance with one or more embodiments of the present invention, a heat spreader is fabricated or selected to be as thin as possible and stamped to have beveled edges to create a more gradual increase in thickness to accommodate a diode package. Accordingly, in an embodiment, the diode and the heat spreader may be candidates for thickness reduction.

Alternatively, in another embodiment, the encapsulation thickness may be modified to accommodate the thickness of the heat spreader and diode. As such, since the encapsulant may serve to bind the diode and interconnects, the thermal adhesive may be used only to thermally couple the diode leads to the heat spreader. Thus, in one embodiment, thermal adhesive need not be included below the diode or diode leads and around the diode package.

Figure 3:
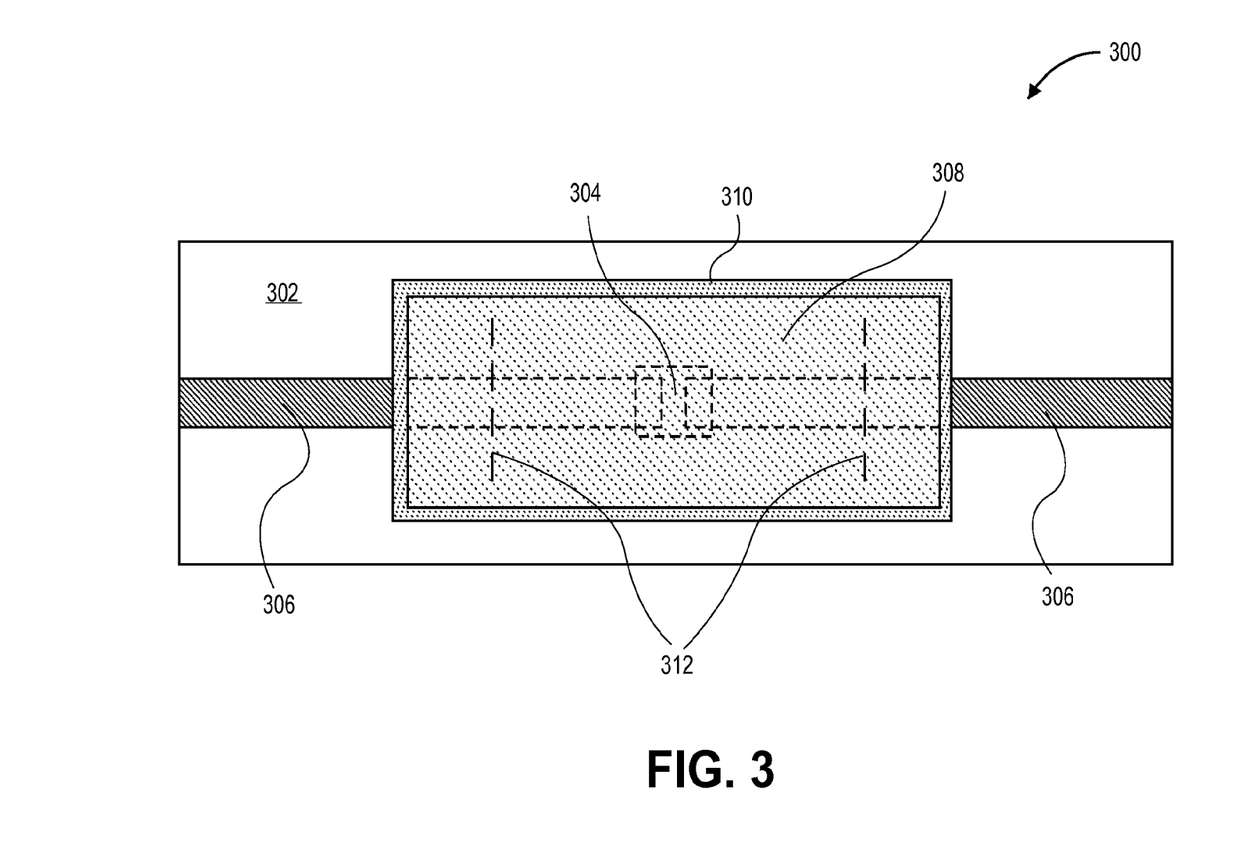
FIG. 3 illustrates a top plan view of a solar module, in accordance with an embodiment of the present invention.

FIG. 3 illustrates a top plan view of a solar module, in accordance with another embodiment of the present invention. Referring to FIG. 3, a portion 300 of a solar module includes a diode 304 mounted above or below a backsheet 302. A pair of interconnects 306 is included with a laminate including backsheet 302. A heat spreader 308 is disposed above the diode 304 and a thermal adhesive 310 is disposed between the heat spreader 308 and the diode 304. In an embodiment, the arrangement depicted in FIG. 3 is suitable for backsheet-mounted packages (and includes backsheet penetrations 312, if necessary), similar to the arrangement described in association with FIG. 1. In another embodiment, however, the arrangement depicted in FIG. 3 is also suitable for in-laminate packages, similar to the arrangement described in association with FIG. 2. Referring again to FIG. 2, in an embodiment, the heat spreader 308 substantially exceeds the width of the diode 304 and interconnects 306 to maximize heat spreading. The heat spreader 308 may be shaped or sized as appropriate for the application and does not necessarily need to be rectangular as shown.

In another aspect of the present invention, the above described solar modules may be included in larger solar systems including many such solar modules. For example, in accordance with an embodiment of the present invention, a solar system includes a plurality of solar cells. A backsheet covers the plurality of solar cells. A plurality of low profile, surface-mount diodes is coupled to the plurality of solar cells. Each low profile, surface-mount diode is disposed above the backsheet. For each low profile, surface-mount diode, also included is a respective pair of ribbon interconnects. Each ribbon interconnect is coupled to the low profile, surface-mount diode and penetrating the backsheet. Also included for each low profile, surface-mount diode is a respective heat spreader mounted directly above the low profile, surface-mount diode. Thus, the solar system includes a plurality of solar modules similar to the solar module described in association with FIG. 1.

In an embodiment, each low profile, surface-mount diode rises less than 10 millimeters above the backsheet. In an embodiment, each low profile, surface-mount diode is attached directly to each ribbon interconnect of the respective pair of ribbon interconnects. In an embodiment, the respective heat spreader is composed of a thin metal strip coated, by a thermally conductive dielectric, on at least one side of the metal strip. In one such embodiment, the respective heat spreader is mounted to the backsheet with a thermal adhesive. In an embodiment, each ribbon interconnect of the respective pair of ribbon interconnects includes four or more bends, a first bend for penetration of the backsheet, a second bend for bringing each ribbon interconnect into a plane of a surface of the backsheet, a third bend to bring each ribbon interconnect vertical, and a fourth bend to bring each ribbon interconnect of the respective pair of ribbon interconnects coplanar with one another and for coupling to the low profile, surface-mount diode.

In another example, in accordance with another embodiment of the present invention, a solar system includes a plurality of solar cells. A backsheet covers the plurality of solar cells. A plurality of diodes is coupled to the plurality of solar cells, each diode disposed under the backsheet. For each diode, also included is a respective pair of ribbon interconnects. Each ribbon interconnect is coupled to the diode and completely covered by the backsheet. Also included for each diode is a respective heat spreader mounted directly above the diode. Thus, the solar system includes a plurality of solar modules similar to the solar module described in association with FIG. 2.

In an embodiment, each ribbon interconnect of the respective pair of ribbon interconnects is above the diode, and the diode is completely covered by the backsheet. In one such embodiment, the diode is attached directly to each ribbon interconnect of the respective pair of ribbon interconnects. In an embodiment, the interconnect of the respective pair of ribbon interconnects. In an embodiment, the respective heat spreader is composed of a thin metal strip having beveled edges and coated, by a thermally conductive dielectric, on at least one side of the metal strip. The respective heat spreader is completely covered by the backsheet. In one such embodiment, the respective heat spreader is mounted, via the thermally conductive dielectric, to the respective pair of ribbon interconnects with a thermal adhesive.

It is to be understood that the above described arrangements for solar modules and solar systems may provide benefits additional to those described above. For example, in one embodiment, by placing diodes in cell laminates, J-shaped busbars need not be included in a solar module package. In another embodiment, since the diodes are included in a cell laminate, needs for specialized or additional packaging to accommodate diodes are no longer required. In another embodiment, interconnects between diodes and a cell laminate are substantially, if not entirely, maintained within the laminate which aids in prevention of interconnect burring or shorting. Also, in one embodiment, since less, if not all, of the material of the interconnects is no longer exposed, the interconnects may not require electrical grounding.

Thus, arrangements of diodes and heat spreaders for solar modules have been disclosed. In accordance with an embodiment of the present invention, a solar module includes a backsheet. A low profile, surface-mount diode is disposed above the backsheet. A pair of ribbon interconnects, each ribbon interconnect is coupled to the low profile, surface-mount diode and penetrates the backsheet. A heat spreader is mounted directly above the low profile, surface-mount diode. In one embodiment, the low profile, surface-mount diode rises less than 10 millimeters above the backsheet. In accordance with another embodiment of the present invention, a solar module includes a backsheet. A diode is disposed under the backsheet. Each ribbon interconnect of a pair of ribbon interconnects is coupled to the diode and completely covered by the backsheet. A heat spreader is mounted directly above the diode. In one embodiment, each of the pair of ribbon interconnects is above the diode, and the diode is completely covered by the backsheet.

What is claimed is:
1. A solar system, comprising:
a plurality of solar cells;
a backsheet covering the plurality of solar cells;
a plurality of electrical components coupled to the plurality of solar cells, each electrical component disposed under the backsheet, and for each electrical component:

a respective pair of ribbon interconnects, each ribbon interconnect coupled to the electrical component and completely covered by the backsheet; and a respective heat spreader mounted directly above the electrical component;

an encapsulant, wherein the electrical components, the ribbon interconnects, and the heat spreaders are at least partially embedded in the encapsulant; and a substrate below the encapsulant and the plurality of electrical components, wherein a first portion of the encapsulant is disposed between the backsheet and the heat spreader, wherein a second portion of the encapsulant is disposed between the backsheet and respective first sides of the ribbon interconnects, wherein a third portion of the encapsulant is disposed between respective second sides of the ribbon interconnects and the substrate, and wherein a fourth portion of the encapsulant is disposed between the plurality of electrical components and the substrate.

2. The solar system of claim 1, wherein each ribbon interconnect of the respective pair of ribbon interconnects is above the electrical component, and the electrical component is completely covered by the backsheet.

3. The solar system of claim 2, wherein the electrical component is attached directly to each ribbon interconnect of the respective pair of ribbon interconnects.

4. The solar system of claim 1, wherein the respective heat spreader comprises a thin metal strip having beveled edges and coated, by a thermally conductive dielectric, on at least one side of the metal strip.

5. The solar system of claim 4, wherein the respective heat spreader is completely covered by the backsheet.

6. The solar system of claim 4, wherein the respective heat spreader is mounted, via the thermally conductive dielectric, to the respective pair of ribbon interconnects with a thermal adhesive.

7. The solar system of claim 1, wherein the substrate comprises a transparent substrate, and wherein the encapsulant is disposed between the backsheet and the transparent substrate.

8. A solar module, comprising:

a backsheet;

an electrical component disposed under the backsheet;

a pair of ribbon interconnects, each ribbon interconnect coupled to the electrical component and completely covered by the backsheet;

a heat spreader mounted directly above the electrical component;

an encapsulant, wherein the electrical component, the pair of ribbon interconnects, and the heat spreader are at least partially embedded in the encapsulant; and a substrate below the encapsulant and the electrical component, wherein a first portion of the encapsulant is disposed between the backsheet and the heat spreader, wherein a second portion of the encapsulant is disposed between the backsheet and respective first sides of the ribbon interconnects, wherein a third portion of the encapsulant is disposed between respective second sides of the ribbon interconnects and the substrate, and wherein a fourth portion of the encapsulant is disposed between the electrical component and the substrate.

9. The solar module of claim 8, wherein each of the pairs of ribbon interconnects is above the electrical component, and the electrical component is completely covered by the backsheet.

10. The solar module of claim 9, wherein the electrical component is attached directly to each of the ribbon interconnects.

11. The solar module of claim 8, wherein the heat spreader comprises a thin metal strip having beveled edges and coated, by a thermally conductive dielectric, on at least one side of the metal strip, and wherein the heat spreader is completely covered by the backsheet.

12. The solar module of claim 11, wherein the heat spreader is mounted, via the thermally conductive dielectric, to each of the ribbon interconnects with a thermal adhesive.

13. The solar module of claim 8, wherein the substrate comprises a transparent substrate, wherein the encapsulant is disposed between the backsheet and the transparent substrate.

14. A solar system comprising a package laminate, the package laminate comprising:

a backsheet;

a plurality of electrical components embedded within the package laminate under the backsheet;

a plurality of heat spreaders, each heat spreader mounted directly above a respective electrical component;

a plurality of ribbon interconnects, each ribbon interconnect electrically connected to a respective electrical component;

an encapsulant, wherein the electrical components, the ribbon interconnects, and the heat spreaders are at least partially embedded in the encapsulant; and a substrate below the encapsulant and the plurality of electrical components, wherein a first portion of the encapsulant is disposed between the backsheet and the plurality of heat spreader, wherein a second portion of the encapsulant is disposed between the backsheet and respective first sides of the ribbon interconnects, wherein a third portion of the encapsulant is disposed between respective second sides of the ribbon interconnects and the substrate, and wherein a fourth portion of the encapsulant is disposed between the plurality of electrical components and the substrate.

15. The solar system of claim 14, wherein the plurality of electrical components comprises a plurality of diodes, the system further comprising a string of solar cells configured to convert light to electricity, the string of solar cells disposed alongside and electrically coupled to the plurality of diodes.

16. The solar system of claim 14, wherein the substrate comprises a transparent substrate, wherein the encapsulant is disposed between the backsheet and the transparent substrate.

17. The solar system of claim 14, wherein each heat spreader has a width exceeding a width of the respective electrical component.

18. The solar system of claim 14, wherein a top surface of the package laminate is defined at least in part by the backsheet, and wherein the top surface comprises a non-uniform surface profile.

19. The solar system of claim 18, wherein each heat spreader comprises a thin metal strip having beveled edges.

20. The solar system of claim 19, wherein the heat spreader is coated on at least one side of the metal strip by a thermally conductive dielectric.

21. The solar system of claim 1, wherein the electrical component comprises a diode.

22. The solar module of claim 8, wherein the electrical component comprises a diode.

\* \* \* \* \*